United States Patent
Matsuura et al.

(10) Patent No.: US 7,501,325 B2
(45) Date of Patent: Mar. 10, 2009

(54) METHOD FOR FABRICATING SEMICONDUCTOR DEVICE

(75) Inventors: Katsuyoshi Matsuura, Kawasaki (JP); Naoya Sashida, Kawasaki (JP)

(73) Assignee: Fujitsu Microelectronics Limited, Tokyo (JP)

(*) Notice: Subject to any disclaimer, the term of this patent is extended or adjusted under 35 U.S.C. 154(b) by 541 days.

(21) Appl. No.: 11/166,228

(22) Filed: Jun. 27, 2005

(65) Prior Publication Data

US 2006/0199342 A1 Sep. 7, 2006

(30) Foreign Application Priority Data

Mar. 3, 2005 (JP) .............................. 2005-059478

(51) Int. Cl.
*H01L 21/336* (2006.01)
(52) U.S. Cl. ............... 438/291; 257/900; 257/E21.626; 257/E21.64
(58) Field of Classification Search .................. 438/291; 257/E21.663
See application file for complete search history.

(56) References Cited

U.S. PATENT DOCUMENTS 6,144,060 A * 11/2000 Park et al. .................... 257/310
6,352,885 B1 * 3/2002 Wieczorek et al. ........... 438/197
6,794,199 B2 * 9/2004 Yoshikawa et al. ............. 438/3
2004/0075109 A1 * 4/2004 Inomata ....................... 257/200
2004/0099893 A1 * 5/2004 Martin et al. ................ 257/295
2005/0255663 A1 * 11/2005 Natori et al. ................. 438/396

FOREIGN PATENT DOCUMENTS

| JP | 2001-44375 | | 2/2001 |
| JP | 2001100742 | * | 5/2002 |
| JP | 2002299585 | * | 11/2002 |
| JP | 2004-193280 | | 7/2004 |

* cited by examiner

*Primary Examiner*—N Drew Richards
*Assistant Examiner*—Ankush K Singal
(74) *Attorney, Agent, or Firm*—Westerman, Hattori, Daniels & Adrian, LLP.

(57) ABSTRACT

The method for fabricating the semiconductor device comprises: the step of forming a ferroelectric capacitor over a semiconductor substrate 10; the step of forming an insulating film 54, covering the ferroelectric capacitor; the step of processing thermal treatment to eliminate hydrogen and/or water adsorbed on a surface of the insulating film 54 or occluded in the insulating film 54; and the step of forming a capacitor protective film 56 of an aluminum oxide film over the insulating film 54. The step of processing the thermal treatment and the step of forming the capacitor protective film are performed continuously in the same system without exposing to an ambient atmosphere.

10 Claims, 8 Drawing Sheets

M/e=18

M/e=18

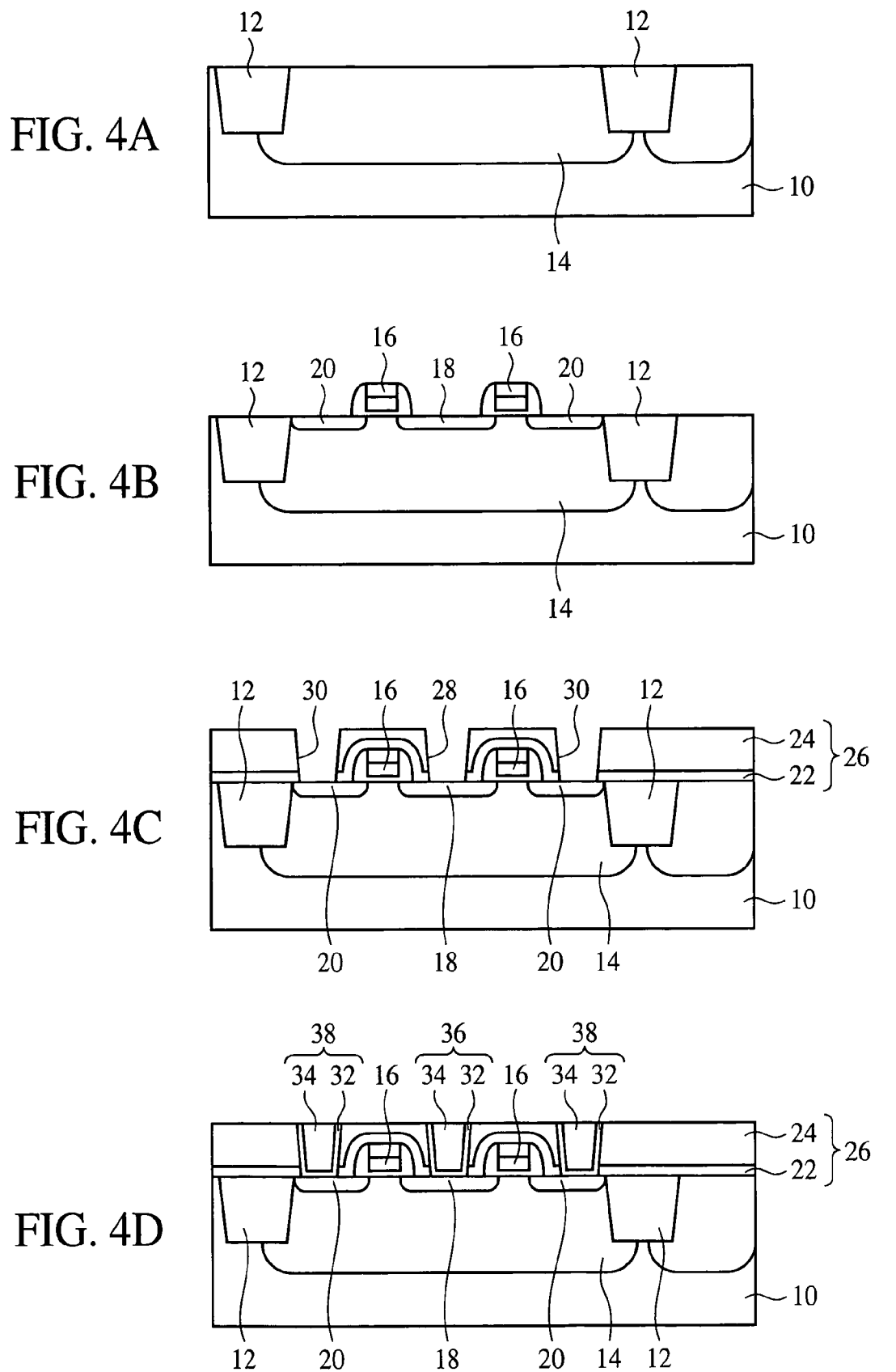

METHOD FOR FABRICATING SEMICONDUCTOR DEVICE

CROSS-REFERENCE TO RELATED APPLICATIONS

This application is based upon and claims the benefit of priority from the prior Japanese Patent Application No. 2005-059478, filed on Mar. 3, 2005, the entire contents of which are incorporated herein by reference.

BACKGROUND OF THE INVENTION

The present invention relates to a semiconductor device fabricating method, more specifically, a method for fabricating a semiconductor device including a ferroelectric capacitor.

In the main memory devices of computers, volatile memories, such as dynamic random access memories (DRAM) and static random access memories (SRAM), etc. are used. The volatile memory can hold data while the power source is being supplied, and loses the data when the supply of the source power is stopped. As nonvolatile memories, which, in contrast to the volatile memory devices, do not lose data even when the supply of the source power is stopped, flash memories and ferroelectric memories (FeRAM) are known.

The flash memory includes a floating gate buried in the gate insulating film of an insulated gate field effect transistor (IG-FET) and stores charges in the floating gate to memorize information. To write and erase information, the flash memory must flow tunnel currents through the insulating film and requires relatively high voltages.

The ferroelectric memory includes a ferroelectric capacitor having a ferroelectric film sandwiched between a pair of electrodes and uses the hysteresis characteristic of the ferroelectric to memorize information. The ferroelectric capacitor has polarization corresponding to a voltage applied between the electrodes and has spontaneous polarization even after the applied voltage has been removed. When a polarity of the applied voltage is inverted, a polarity of the spontaneous polarization is also inverted. The ferroelectric memory associates a direction of the spontaneous polarization with memorized information to function as a memory device and detects a direction of the spontaneous polarization to read memorized information. The ferroelectric memory is operative at lower voltages than the flash memory and prospectively can write at high speed with saved electric power.

The semiconductor device fabricating process includes steps in which hydrogen is generated, such as steps for growing inter-layer insulating films. The ferroelectric material is easily reduced with hydrogen, and to fabricate ferroelectric memories of good quality, a capacitor protective film which functions as the hydrogen barrier must be formed, covering the ferroelectric film.

Reference 1 (Japanese published unexamined patent application No. 2001-044375) describes that a capacitor protective film of an aluminum oxide film ($Al_2O_3$) of a film density of not less than 2.7 $g/cm^3$ is formed, covering the top of the ferroelectric capacitor, whereby the reduction of the ferroelectric film with a reductive gas, such as hydrogen or others, is prevented. In Reference 1, RF sputtering method using an aluminum oxide target is used to thereby form an amorphous aluminum oxide film while suppressing the generation of particles.

However, for the ferroelectric memory of the next generation, it is preferred to form the capacitor protective film by CVD (Chemical Vapor Deposition) method. This is because the film formation by the current sputtering method is inferior to the film formation by CVD method in the step coverage, and the capacitor protective film formed by the former may degrade the coverage of the capacitor protective film in the stacked capacitor structure of the next generation whose aspect ratio will be larger.

Usually, to form aluminum oxide film by CVD method, tri-methyl aluminum (TMA, $Al(CH_3)_3$) and water ($H_2O$) as the oxidizer are used, and ALD (Atomic Layer Deposition) method is used.

However, when aluminum oxide film as the capacitor protective film of the ferroelectric memory is actually formed by CVD method using TAM and $H_2O$, the ferroelectric film is degraded which makes it impossible for the ferroelectric memory to function as a ferroelectric memory. This is because when aluminum oxide film is formed by the above-described method in which much $H_2O$ is used, hydrogen or water is adsorbed to the ferroelectric film, or hydrogen remains in the aluminum oxide film, and the hydrogen or water causes reduction of the ferroelectric film in thermal processing in later steps.

Reference 2 (Japanese published unexamined patent application No. 2004-193280) discloses a method for forming an aluminum oxide film as the capacitor protective film of the ferroelectric memory by CVD method using TMA and ozone ($O_3$). That is, the use of $O_3$, which is a hydrogen-free oxidizer, prevents the adsorption of hydrogen or water to the ferroelectric film or the residue of hydrogen in the aluminum oxide film. Thus, the activation of the hydrogen in thermal processing in later steps can be suppressed to thereby prevent the degradation of characteristics of the ferroelectric film.

However, even when aluminum oxide film as the capacitor protective film of the ferroelectric memory is formed by CVD method using TMA and $O_3$, the characteristic degradation which is found to be due to the hydrogen or water often takes place in the ferroelectric capacitor.

SUMMARY OF THE INVENTION

An object of the present invention is to provide a method for fabricating a semiconductor device which can suppress characteristics degradation of the ferroelectric capacitor by the influence of hydrogen and water introduced into in fabrication steps.

According to one aspect of the present invention, there is provided a method for fabricating a semiconductor device comprising the steps of: forming a ferroelectric capacitor over a semiconductor substrate; forming an insulating film, covering the ferroelectric capacitor; processing a thermal treatment for eliminating hydrogen and/or water adsorbing on a surface of the insulating film or occluded in the insulating film; and forming a first capacitor protective film of an aluminum oxide film over the insulating film, the step of processing the thermal treatment and the step of forming the first capacitor protective film being performed continuously in the same system without exposing to an ambient atmosphere.

According to the present invention, the thermal processing for eliminating hydrogen and water adsorbing on the surface of the insulating film covering the ferroelectric capacitor and/or occluded in the insulating film, whereby the characteristics degradation of the ferroelectric capacitor due to hydrogen eliminated from the insulating film in thermal processing in later steps.

The thermal processing for heating the insulating film covering the ferroelectric capacitor, and the step of forming the capacitor protective film on the insulating film are performed continuously without the exposure to the ambient atmosphere, whereby the adsorption of hydrogen and water to the surface of the insulating film and/or occlusion of hydrogen and water in the insulating film until the capacitor protective film is formed can be prevented. The characteristics degradation of the ferroelectric capacitor can be further effectively prevented.

When inter-layer insulating films, etc. to be formed on the first-level metal interconnection layer are formed a film forming process using $SiH_4$, Ar, $O_2$ or others as raw material gases, such as high density plasma CVD method, the capacitor protective film blocks hydrogen, whereby the characteristics degradation of the ferroelectric capacitor can be prevented.

BRIEF DESCRIPTION OF THE DRAWINGS

FIGS. 4A-4D, 5A-5C, 6A-6C, and 7A-7B are sectional views showing the semiconductor device of the first embodiment of the present invention in the steps of the method for fabricating the same.

DETAILED DESCRIPTION OF THE PREFERRED EMBODIMENT

A First Embodiment

The method for fabricating the semiconductor device according to a first embodiment of the present invention will be explained with reference to FIGS. 1 to 9.

Figure 1:
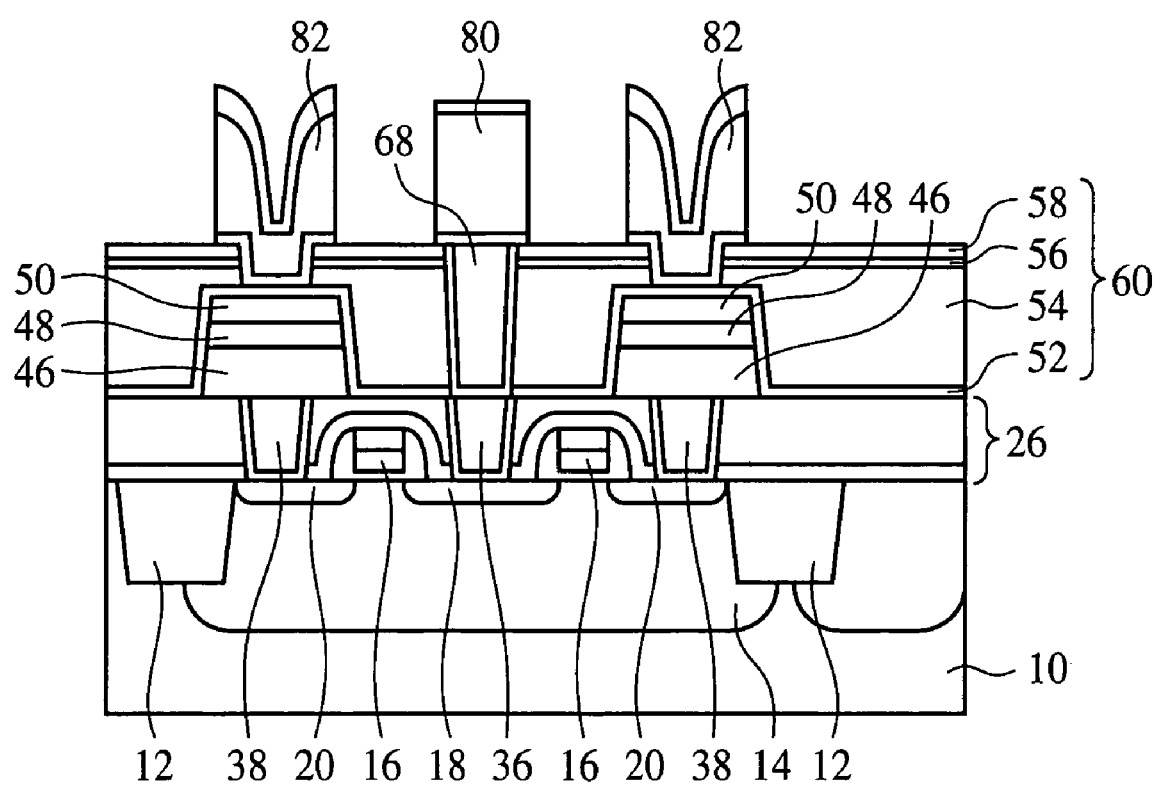
FIG. 1 is a diagrammatic sectional view showing a structure of a semiconductor device of a first embodiment of the present invention.
Figure 2:
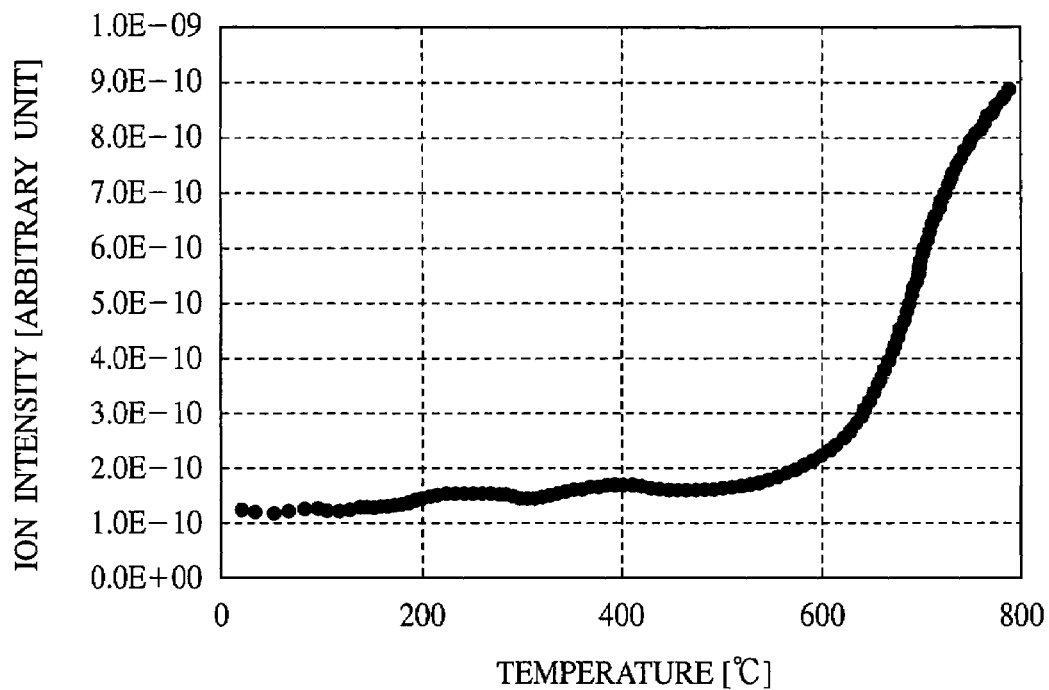
FIGS. 2 and 3 are graphs of the relationships between the ion intensity of $H_2O$ eliminated from silicon oxide film and the temperature.
Figure 3:
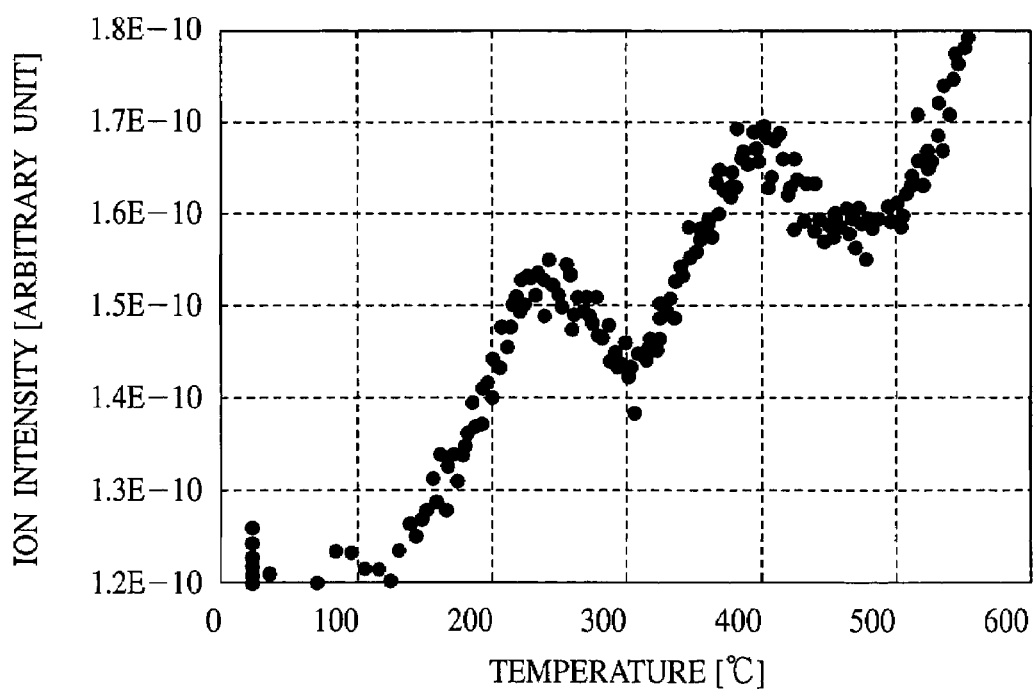

FIG. 1 is a diagrammatic sectional view showing a structure of a semiconductor device of the present embodiment. FIGS. 2 and 3 are graphs of the relationships between ion intensity of $H_2O$ ions eliminated from a silicon oxide film and the temperature. FIGS. 4A to 7B are sectional views showing the semiconductor device of the present embodiment in the steps of method for fabricating the same. FIGS. 8A-8D are views explaining the mechanism for forming aluminum oxide film by atomic layer deposition using TMA and $O_3$. FIG. 9 is a diagrammatic view showing a structure of a multi-chamber sputtering system.

First, the structure of the semiconductor device according to the present embodiment will be explained with reference to FIG. 1.

In a silicon substrate 10, a device isolation region 12 for defining an active region is formed. In the silicon substrate 10, a p-well 14 is formed. On the surface of the active region where the p-well 14 is formed in, MOS transistors each including a gate electrode 16 and source/drain regions 18, 20 are formed.

An inter-layer insulating film 26 is formed over the silicon substrate 10 with the MOS transistors formed on. Tungsten plugs 36, 38 connected respectively to the source/drain regions 18, 20 are buried in the inter-layer insulating film 26.

Over the inter-layer insulating film 26 with the tungsten plugs 36, 38 buried in, ferroelectric capacitors each including a lower electrodes 46, a ferroelectric film 48 and upper electrodes 50 are formed.

Over the inter-layer insulating film 26 with the ferroelectric capacitors formed on, an inter-layer insulating film 60 including a capacitor protective film 52 of an aluminum oxide film, a silicon oxide film 54 formed by plasma CVD method using TEOS (tetraethoxysilane), a capacitor protective film 56 of an aluminum oxide film, and a silicon oxide film 58 is formed. A tungsten plug 68 is buried in the inter-layer insulating film 60, connected to the tungsten plug 36.

Over the inter-layer insulating film 60, a bit line 80 electrically connected to the source/drain region 18 of the MOS transistors via the tungsten plugs 68, 36, and interconnections 82 electrically connected to the upper electrodes 50 of the ferroelectric capacitors are formed.

Thus, a ferroelectric memory including the MOS transistors and the ferroelectric capacitors is constituted.

As shown in FIG. 1, in the semiconductor device according to the present embodiment, the capacitor protective film 56 is formed also over the insulating film (silicon oxide film 54) covering the tops of the ferroelectric capacitors. The silicon oxide film 54 has the surface planarized, which allows the capacitor protective film 56 to be formed thereon by sputtering method, and this improves the tendency of blocking $H_2O$ and $H_2$.

However, simply forming the capacitor protective film 56 over the silicon oxide film 54 covering the ferroelectric capacitors causes the characteristics degradation of the ferroelectric capacitors. The cause for this will be explained below.

It is generally known that the silicon oxide film formed by plasma CVD method using TEOS absorbs water. The inventors of the present application made an experiment in the $H_2O$ content in the silicon oxide film formed by plasma CVD method using TEOS. Specifically, a 500 nm-thick silicon oxide film was deposited on a silicon substrate by plasma CVD method using TEOS and was evaluated by thermal desorption spectroscopy (TDS).

FIG. 2 is a graph plotting the spectrum of M/e=18 alone corresponding to $H_2O$. The peak on the side of the higher temperature following 650° C. will be due to $H_2O$ generated by the dehydration reaction among the OH groups in the Si—OH bonds which are present in the silicon oxide film in not a small number.

FIG. 3 is an enlarged partial graph of FIG. 2. As shown in FIG. 3, peaks can be formed at temperatures near 250° C. and 400° C. These peaks will be due to the $H_2O$ which had been occluded in micro-pores in the silicon oxide film, which were eliminated. That is, the silicon oxide film formed by plasma CVD method using TEOS will be porous.

When the capacitor protective film 56 of aluminum oxide film is formed over the silicon oxide film 54 which has absorbed water, $H_2O$ in the silicon oxide film 54 cannot escape due to the high blocking tendency of aluminum oxide film for $H_2O$. When thermal processing of not less than 250° C. is performed after the capacitor protective film 58 of aluminum oxide film has been made, accordingly the ferroelectric capacitors are like being baked in a casserole. Resultantly, even with the protective film 52 formed on the ferroelectric capacitor, the effect is lowered, and the characteristics degradation of the ferroelectric film is caused, the switching charge quantity $Q_{sw}$ is lowered.

Then, according to the method for fabricating the semiconductor device according to the present embodiment, the capacitor protective film 58 is formed after dehydration annealing for eliminating hydrogen and water in the silicon oxide film 56 has been made. This dehydration is for accelerating the elimination of the hydrogen and water at the temperatures near 250° C. and 400° C. as shown in FIG. 3, and requires an annealing temperature of not less than about 350° C. When the annealing temperature is too high, a large amount of $H_2O$ generated by the mutual dehydration reaction among the OH groups of the Si—OH bonds is eliminated, and to the contrary, the capacitor characteristics are degraded. Thus, the annealing temperature must be not more than about 650° C. at highest.

After the dehydration annealing, if the substrate is once exposed to the ambient atmosphere and loaded into a film forming system for forming the capacitor protective film 58, the dehydration annealing cannot be sufficiently effective because hydrogen and water in the ambient atmosphere adsorb to the silicon oxide film 56. Preferably, the step of the dehydration annealing and the step of forming the capacitor protective film are performed continuously without exposing the substrate to the ambient atmosphere.

To continuously perform the step of the dehydration annealing and the step of forming the capacitor protective film 58, the method using a multi-chamber film forming system (the present embodiment), the method of performing the steps continuously in the same furnace (a second embodiment) or other methods can be exemplified.

Next, the method for fabricating the semiconductor device according to the present embodiment will be specifically explained with reference to FIGS. 4A to 9.

First, a device isolation film 12 for defining the active region is formed in the silicon substrate 10 by, e.g., STI (Shallow Trench Isolation) method.

Then, the p-well 14 is formed in the silicon substrate 10 by ion implantation (FIG. 4A).

Then, in the active region where the p-well 14 is formed, the MOS transistors each including the gate electrode 16 and the source/drain regions 18, 20 are formed in the same way as by the usual MOS transistor fabricating method (FIG. 4B).

Over the silicon substrate 10 with the MOS transistors formed on, a silicon oxynitride film 22 and a silicon oxide film 24 are deposited by, e.g., CVD method. The silicon oxynitride film 22 is the stopper layer for etching the contact holes and for improving the water resistance.

Then, the surface of the silicon oxide film 24 is polished by CMP (Chemical Mechanical Polishing) method to form the inter-layer insulating film 26 which is formed of the silicon oxynitride film 22 and the silicon oxide film 24 and has the surface planarized.

Next, the contact holes 28, 30 are formed in the inter-layer insulating film 26 respectively down to the source/drain regions 18, 20 by photolithography and dry etching (FIG. 4C).

Then, a titanium film of, e.g., a 30 nm-thick and a titanium nitride (TiN) film of, e.g., a 50 nm-thick are sequentially deposited as a glue film 32 by, e.g., sputtering method.

Next, a tungsten (W) film 34 is deposited on the glue film 32 by, e.g., CVD method.

Then, the tungsten film 34 and the glue film 32 are polished back by, e.g., CMP method to form the tungsten plugs 36, 38 which are respectively buried in the contact holes 28, 30 and formed of the tungsten film 34 and the glue film 32 (FIG. 4D).

Then, an iridium (Ir) film of, e.g., a 200 nm-thick is deposited by sputtering method over the inter-layer insulating film 26 with the tungsten plugs 36, 38 buried in. Conditions for forming the iridium film 40 are, e.g., a 0.11 Pa argon gas pressure, a 0.5 kW DC power, a 335 second deposition period of time and a 500° C. deposition temperature.

Next, a PZT (lead zirconate titanate) film 42 of, e.g., a 120 nm-thick is deposited on the iridium film 40 by, e.g., solution evaporating-type MOCVD method.

The PZT film 42 is formed by solving Pb, Zr and Ti as the solid raw materials in respective organic compound solutions, evaporating the solutions with the raw materials solved in to generate the raw material gases, and feeding the raw material gases into the reaction chamber. The respective raw materials and their flow rates are, e.g., 0.474 ml/min of THF (Tetra-Hydro Furan $C_4H_8O$), 0.326 ml/min of the 0.3 mol/l $Pb(DPM)_2$ THF solution as the Pb raw material, 0.200 ml/min of the 0.3 mol/l $Zr(dmhd)_4$ THF solution as the Zr raw material, and 0.200 ml/min of the 0.3 mol/l $Ti(O-iPr)_2(DPM)_2$ THF solution as the Ti raw material. The film forming pressure is, e.g., 5 Torr, the film forming temperature is, e.g., 620° C., and the time is, e.g., 620 seconds.

Figure 5A:
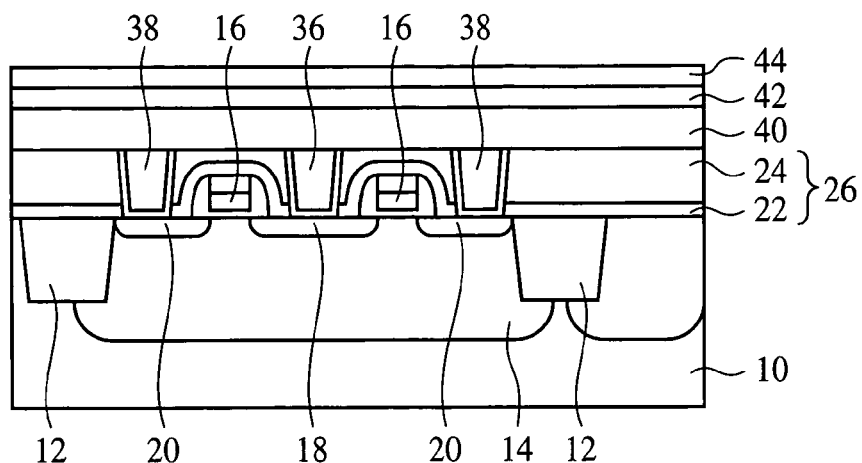

Then, over the PZT film 42, iridium oxide ($IrO_2$) film 44 is deposited by, e.g., sputtering method (FIG. 5A).

Next, furnace annealing of, e.g., 500° C. and 60 minutes is performed to as to restore the PZT film 42 damaged when the iridium oxide film 44 was formed.

Figure 5B:
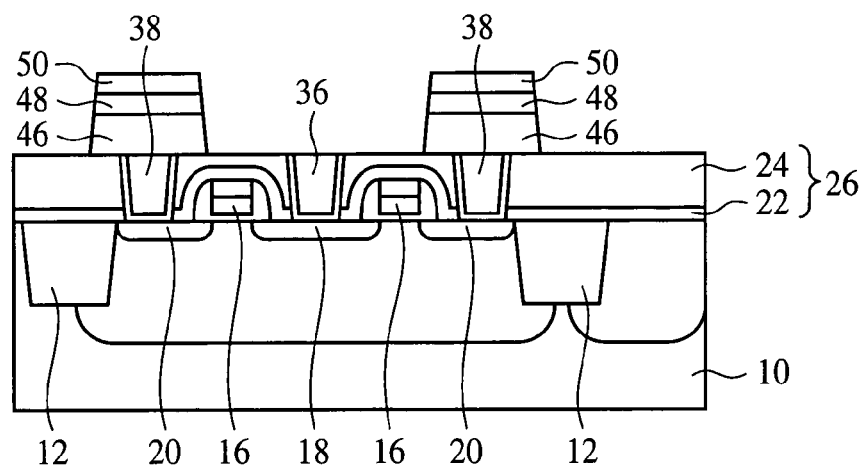

Then, the iridium oxide film 44, the PZT film 42 and the iridium film 40 are patterned by photolithography and dry etching to form the ferroelectric capacitors of the stacked structure of the lower electrodes 46 of the iridium film 40, capacitor dielectric film 48 of the PZT film 42 and the upper electrodes 50 of the iridium oxide film 44 (FIG. 5B). At this time, the use of, e.g., the stacked film of the TiN film and the plasma TEOS oxide film as the hard mask makes it possible to pattern at once the upper electrodes 50, the capacitor dielectric film 48 and the lower electrodes 46.

The upper electrodes 50 are formed of iridium oxide in place of platinum for the improvement of the resistance of degradation by hydrogen. Platinum catalyzes hydrogen molecules, and hydrogen radicals tend to be generated to degrade the capacitor dielectric film 48. In contrast to this, iridium oxide does not catalyze hydrogen molecules, and hydrogen radicals are not easily generated. The degradation of the capacitor dielectric film 48 by hydrogen can be suppressed.

Figure 5C:
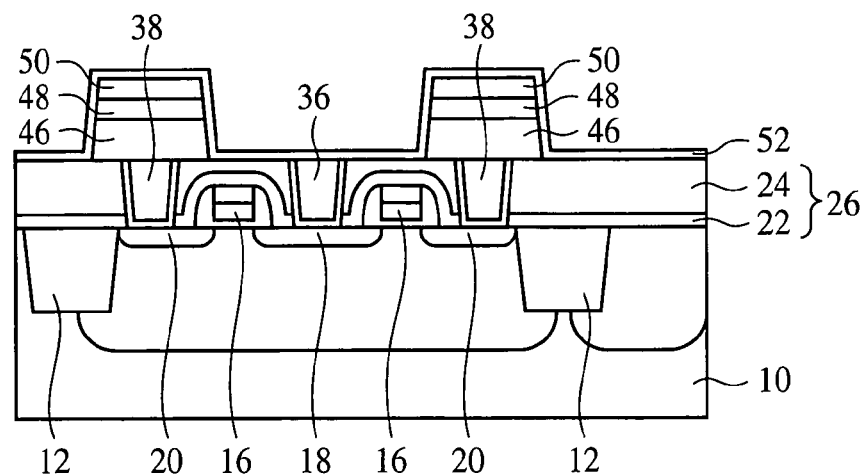

Next, an aluminum oxide film of, e.g., a 20 nm-thick is deposited over the upper surface and the side surface of the ferroelectric capacitors, and the inter-layer insulating film 24 by ALD (Atomic Layer Deposition) method using, e.g., TMA and $O_3$ as the raw materials to form the capacitor protective film 52 of the aluminum oxide film (FIG. 5C).

The film forming mechanism for depositing the aluminum oxide film by ALD is as illustrated in FIG. 8. First, $O_3$ is fed into the reaction furnace, and oxygen is adsorbed, covering the entire surface of the substrate (FIG. 8A). Then, the residual $O_3$ in the reaction furnace is evacuated, and the interior of the reaction furnace is purged with nitrogen gas. Then, TMA is fed into the reaction furnace to cause to react with the oxygen adsorbed on the substrate to form an atomic layer of $Al_2O_3$ (FIGS. 8B and 8C). Then, the residual TMA in the reaction furnace is evacuated, and the interior of the reaction furnace is purged with nitrogen gas. Then, $O_3$ is fed into the reaction furnace to dissociate the organic groups remaining on the substrate while oxygen is adsorbed, covering all the substrate surface (FIG. 8D). Then, the deposition step of feeding TMA into the reaction furnace and the oxidation step of feeding $O_3$ into the film forming chamber are alternated with the vacuum purge taking place therebetween by a required cycle number, e.g., 220 cycles, required to a required film thickness.

Conditions for the film formation in the deposition step are, e.g., a 250° C. substrate temperature, a 0.2 Torr gas pressure, a 100 sccm TMA gas flow rate, a 0 sccm $O_3$ gas flow rate and a 3 second period of time. Conditions for the film formation in the oxidation step are, e.g., a 250° C. substrate temperature, a 1.0 Torr gas pressure, a 0 sccm TMA gas flow rate, a 1000 sccm $O_3$ gas flow rate and a 6 second period of time.

In the atomic layer deposition method using TMA and $O_3$ as the raw materials, preferably the film forming temperature is below 350° C. This is because when the film is deposited at a temperature higher than 350° C., the capacitor dielectric film 48 is degraded by hydrogen in $CH_3$ contained in the TMA.

Then, furnace annealing of, e.g., 650° C. is performed in, e.g., oxygen ($O_2$) atmosphere.

Next, the silicon oxide film 54, for example, is deposited over the capacitor protective film 52 by, e.g., plasma CVD method using TEOS.

Figure 6A:
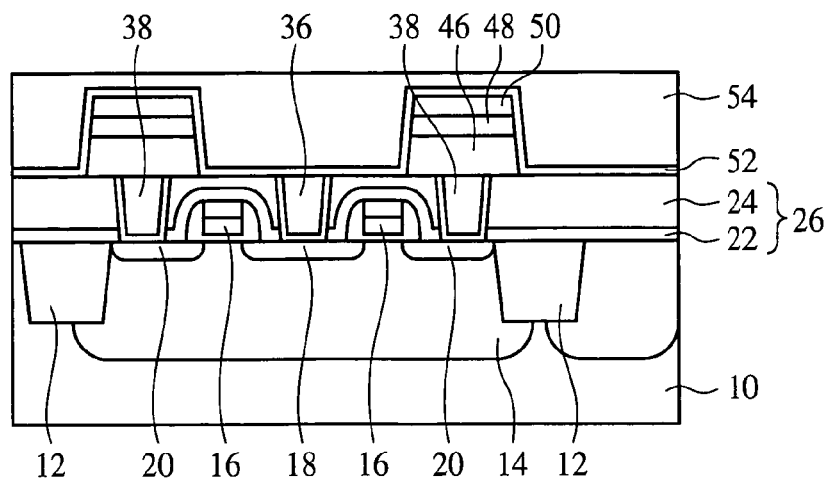

Next, the surface of the silicon oxide film 54 is polished by, e.g., CMP method to planarize the surface of the silicon oxide film 54 (FIG. 6A). The polish of the silicon oxide film 54 is controlled so that the film thickness of the silicon oxide film 54 over the upper electrodes 50 becomes, e.g., 300 nm.

Then, thermal treatment (dehydration annealing) for dehydrating the silicon oxide film 54 is performed, and the capacitor protective film 56 is formed. It is not preferable that after the dehydration annealing, the substrate is once exposed to the ambient atmosphere, and then the capacitor protective film 56 is formed. This is because hydrogen and water in the ambient atmosphere are adsorbed to the silicon oxide film 56. Accordingly, it is preferable to perform the dehydration anneal and form the capacitor protective film 56 continuously in a system which does not require the exposure to the ambient atmosphere after the dehydration anneal, e.g., a multi-chamber sputtering system.

FIG. 9 is a diagrammatic view of one example of the multi-chamber sputtering system. The sputtering system shown in FIG. 9 comprises a load-lock chamber 100 and 5 processing chambers 102, 104, 106, 108, 110 interconnected via a vacuum carrier system 112. The substrate can be transported between the respective chambers by an arm 114 provided in the vacuum carrier system 112.

When the multi-chamber sputtering system shown in FIG. 9 is used, first the substrate is loaded in the load-lock chamber 100, and the load-lock chamber 100 is evacuated.

Then, the substrate is carried from the load-lock chamber 100 to the chamber (e.g., the processing chamber 102) for the dehydration via the vacuum carrier system 112 and is subjected to the thermal processing (dehydration annealing) in the chamber. Conditions for the dehydration annealing are, e.g., a 500° C. processing temperature and a 2 minutes period of time. The dehydration annealing is performed in the temperature range of 350-650° C. as described above.

Then, the substrate which has been subjected to the dehydration annealing is carried from the processing chamber 102 to the chamber (e.g., the processing chamber 104) for the film deposition via the vacuum carrier system 112. Thus, the substrate which has been subjected to the dehydration annealing can be carried to the chamber for the film deposition without exposing to the ambient atmosphere the substrate subjected to the dehydration annealing.

Figure 6B:
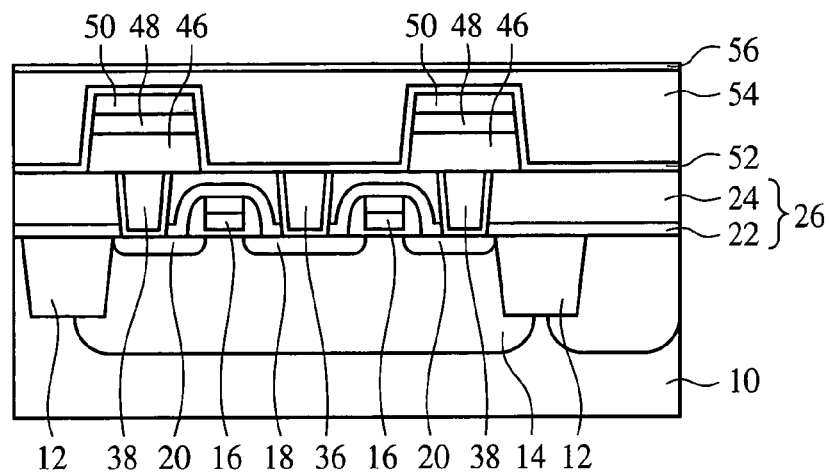

Then, in the chamber for the film deposition, the capacitor protective film 56 of, e.g., a 50 nm-thick aluminum oxide film is formed by, e.g., RF sputtering method (FIG. 6B). The surface of the silicon oxide film 54 has been planarized, which allows the capacitor protective film 56 to be formed by sputtering method. Conditions for forming the capacitor protective film 56 of aluminum oxide film are an aluminum oxide target, and, e.g., a 0.7 Pa gas pressure, a 20 sccm Ar gas flow rate, a 2.0 kW RF power and a 100 seconds period of time.

To form the aluminum oxide film by sputtering method, it is preferable to use RF sputtering method using an aluminum oxide target. DC sputtering method using an aluminum target and an oxygen-content gas increases dust, which makes it difficult to form the aluminum oxide film of good quality.

Then, the silicon oxide film 58 of, e.g., a 200 nm-thick is deposited over the capacitor protective film 56 by, e.g., plasma CVD method using TEOS.

Figure 6C:
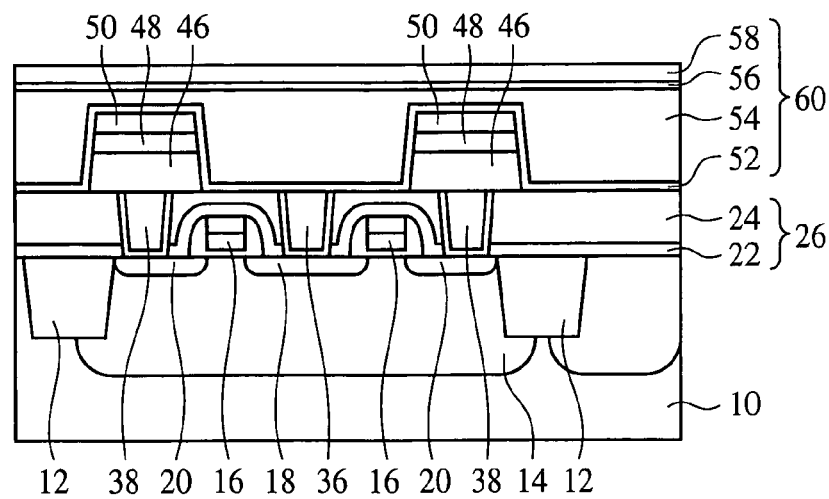

Thus, the inter-layer insulating film 50 of the capacitor protective film 52, the silicon oxide film 54, the capacitor protective film 56 and the silicon oxide film 58 is formed over the inter-layer insulating film 26 with the ferroelectric capacitors formed on (FIG. 6C).

Then, the contact hole 62 down to the tungsten plug 36 is formed in the inter-layer insulating film 60 by photolithography and dry etching.

Then, a titanium nitride (TiN) film of, e.g., a 50 nm-thick is deposited as the glue film 62 by, e.g., sputtering method.

Next, a tungsten (W) film 66 is deposited on the glue film 64 by, e.g., CVD method.

Figure 7A:
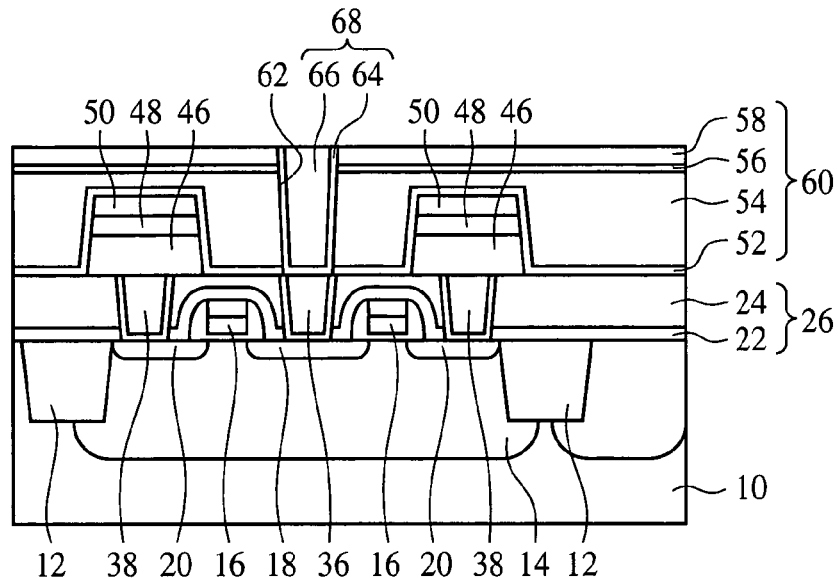

Then, the tungsten film 66 and the glue film 64 are polished back by, e.g., CMP method to form the tungsten plug 68 buried in the contact hole 62 and formed of the tungsten film 66 and the glue film 64 (FIG. 7A).

Thus, the contact to the source/drain region 18 via the two tungsten plugs 36, 68 can be formed. In comparison with the usual logic device, the ferroelectric memory has a step corresponding to the ferroelectric capacitors, which makes the aspect ratio of the contact to the substrate larger. If the contact is formed by once etching, the etching itself and additionally the burying of the glue film will be difficult, and a latest system will be necessary. The contact to the source/drain region 18 via the two tungsten plugs 36, 38 is formed as in the present embodiment, whereby the fabrication yield can be increased, the known system can be used. The development expense decrease and the fabrication cost reduction can be realized.

Next, thermal processing of 350° C. and a 120 second period of time is performed in, e.g., $N_2$ plasmas.

Then, a tungsten oxidation preventing film (not shown) is formed over the entire surface. The tungsten oxidation preventing film can be, e.g., a 100 nm-thick silicon oxynitride (SiON) film.

Next, the tungsten oxidation preventing film, the silicon oxide film 58, the capacitor protective film 56 and the silicon oxide film 54 are patterned by photolithography and dry etching to form contact holes 70 down to the upper electrodes 50 of the ferroelectric capacitors.

Then, thermal processing for restoring the damage made in etching the contact hole 70 is performed. For example, furnace annealing of, e.g., 500° C. and 60 minutes is performed in oxygen ($O_2$) ambient. At this time, the hydrogen and water in the silicon oxide film 54 have been eliminated by the high temperature dehydration annealing, and substantially no hydrogen and water are eliminated from the silicon oxide film 54. The characteristics degradation of the ferroelectric capacitor never takes place.

Then, the tungsten oxidation preventing film is removed by, e.g., etching back.

Then, over the inter-layer insulating film 70 with the contact holes 70 formed in, a 60 nm-thick Ti film and a 30 nm-thick TiN film, for example, as a glue film 72, a 400 nm-thick Al—Cu film, for example, as a main interconnection layer 74, and a 5 nm-thick Ti film and a 70 nm-thick TiN film, for example, as a glue film 76 are sequentially deposited.

Figure 7B:
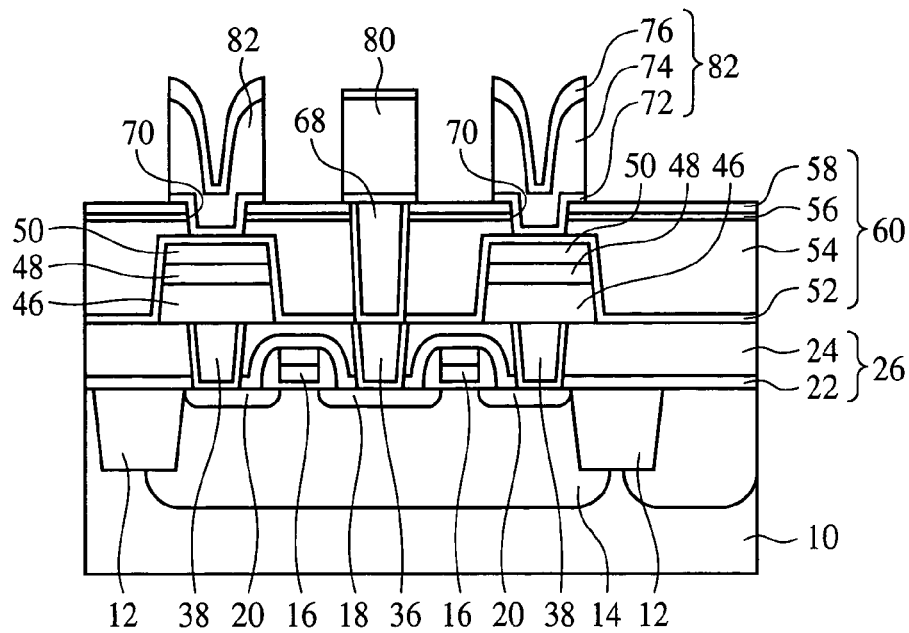

Then, a 3 nm-thick SiON film (not shown), for example, as an antireflection film is formed on the glue film 76, and the antireflection film, the glue film 76, the main interconnection layer 74 and the glue film 72 are patterned to form the bit line 80 electrically connected to the source/drain region 18 via the contact plugs 68, 36, and the interconnection layer 82 electrically connected to the upper electrodes 50 of the ferroelectric capacitors (FIG. 7B).

Then, furthermore, inter-layer insulating films, and a second-level metal interconnection layer and the following interconnection layers are formed. Then, the cover film of a silicon oxide film and a silicon nitride film is formed. At this time, the capacitor protective films 52, 56 block hydrogen also in forming the silicon oxide film, etc. by a film forming processing using $SiH_4$, Ar, $O_2$, etc. as the raw material gases, such as high density plasma CVD method, whereby the characteristics degradation of the ferroelectric capacitors can be prevented.

As described above, according to the present embodiment, thermal processing is performed for eliminating hydrogen and water adsorbed on and/or occluded in the insulating film covering the ferroelectric capacitors, whereby the characteristics degradation of the ferroelectric capacitors due to hydrogen elimination from the insulating film in the thermal processing in the later steps can be prevented.

The thermal processing of the insulating film and the formation of the capacitor protective film formed over the insulating film are performed continuously without the exposure to the ambient atmosphere, whereby the adsorption and/or occlusion of hydrogen and water to the surface of the insulating film and in the insulating film can be prevented until the capacitor protective film is formed. Thus, the characteristics degradation of the ferroelectric capacitors can be more effectively prevented.

Even when the inter-layer insulating films, etc. to be formed over the first-level metal interconnection layer are formed by a film forming processing using hydrogen as the raw material gas, such as high density plasma CVD method or others, the capacitor protective films block hydrogen, whereby the characteristics degradation of the ferroelectric capacitor can be prevented.

A Second Embodiment

The method for fabricating the semiconductor device according to a second embodiment of the present invention will be explained. The same members of the present embodiment as those of the semiconductor device fabricating method according to the first embodiment shown in FIGS. 1 to 9 are represented by the same reference numbers not to repeat or to simplify their explanation.

In the method for fabricating the semiconductor device according to the first embodiment, the hydration annealing for the silicon oxide film 54 covering the ferroelectric capacitor, and the deposition of the capacitor protective film 56 over the silicon oxide film 54 are performed continuously in the multi-chamber sputtering system. However, an ALD system may be also used. The ALD system can be, e.g., a batch ALD system. In the batch film forming system, a plurality of substrates is loaded once in the furnace to be processed, and the throughput can be high.

The method for fabricating the semiconductor device using the ALD system will be explained below.

First, in the same way as in, e.g., the method for fabricating the semiconductor device according to the first embodiment shown in, FIGS. 4A to 6A, MOS transistors, ferroelectric capacitors, a capacitor protective film 52 and a silicon oxide film 54 are formed.

Next, oxygen is flowed in the reaction furnace of the ALD system for forming the capacitor protective film 56, and the temperature inside the furnace is raised to a dehydration annealing temperature of 350-650° C., e.g., up to 450° C.

Then, substrates to be processed are carried into the reaction furnace whose interior temperature has been raised, and thermal processing (dehydration annealing) of, e.g., 30 minutes is performed.

Then, with the substrates kept loaded in the reaction furnace, the temperature in the furnace is lowered to a film forming temperature of the capacitor protective film 56, e.g., down to 250° C.

Then, in accordance with the film forming mechanism of aluminum oxide film by the atomic layer deposition process shown in FIG. 8, an aluminum oxide film of, e.g., a 20 nm-thick is deposited to form a capacitor protective film 56 of the aluminum oxide film.

Figure 8A:
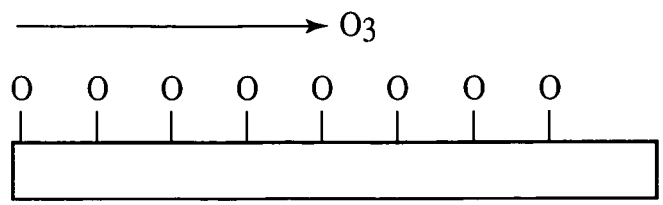
FIGS. 8A-8D are views explaining the film forming mechanism of aluminum oxide film by atomic layer deposition using TMA and $O_3$.
Figure 8B:
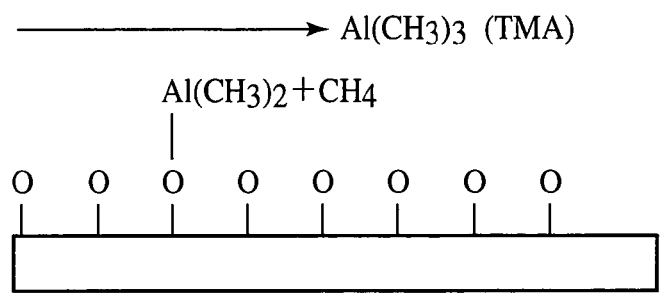
Figure 8C:
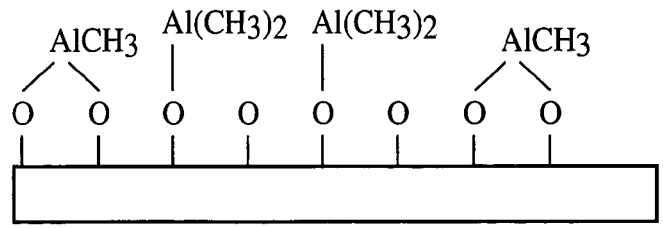
Figure 8D:
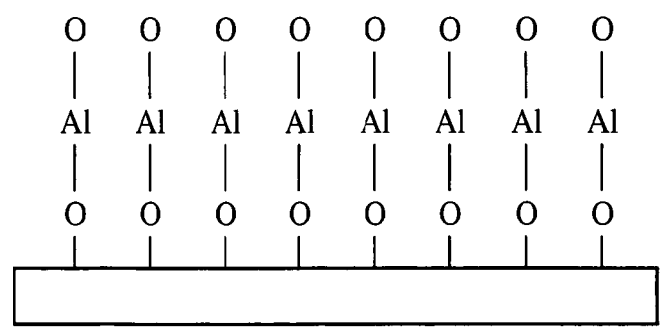
Figure 9:
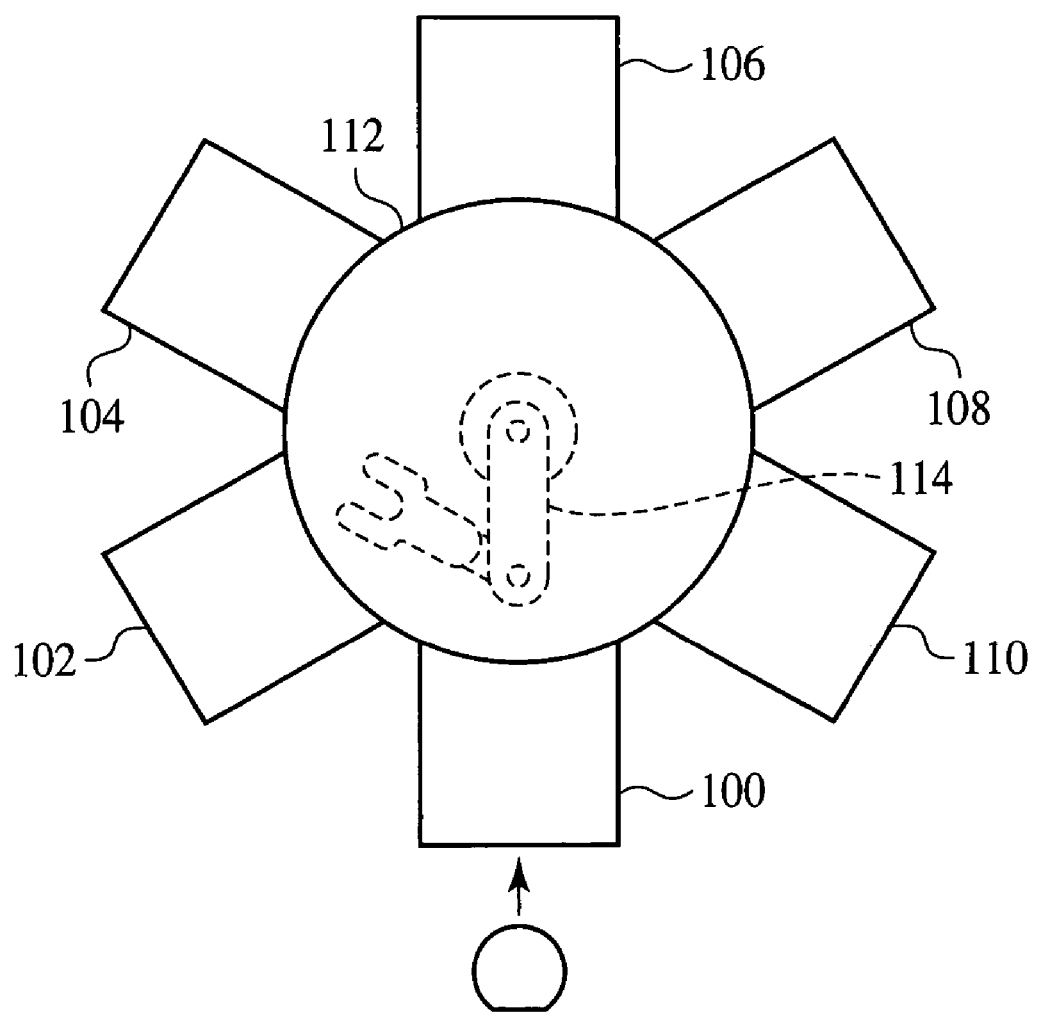
FIG. 9 is a diagrammatic view showing a structure of a multi-chamber sputtering system.

First, $O_3$ is fed into the reaction furnace, and oxygen is adsorbed, covering the entire surface of the substrate (FIG. 8A). Then, the residual $O_3$ in the reaction furnace is evacuated, and the interior of the reaction furnace is purged with nitrogen gas. Then, TMA is fed into the reaction furnace to cause to react with the oxygen adsorbed on the substrate to form an atomic layer of $Al_2O_3$ (FIGS. 8B and 8C). Then, the residual TMA in the reaction furnace is evacuated, and the interior of the reaction furnace is purged with nitrogen gas. Then, $O_3$ is fed into the reaction furnace to dissociate the organic groups remaining on the substrate while oxygen is adsorbed, covering all the substrate surface (FIG. 8D). Then, the deposition step of feeding TMA into the reaction furnace and the oxidation step of feeding $O_3$ into the reaction furnace are alternated with the vacuum purge taking place therebetween by a required cycle number, e.g., 220 cycles, required to a required film thickness.

Conditions for the film formation in the deposition step are, e.g., a 250° C. substrate temperature, a 0.2 Torr gas pressure, a 100 sccm TMA gas flow rate, a 0 sccm $O_3$ gas flow rate and a 3 second period of time. Conditions for the film formation in the oxidation step are, e.g., a 250° C. substrate temperature, a 1.0 Torr gas pressure, a 0 sccm TMA gas flow rate, a 1000 sccm $O_3$ gas flow rate and a 6 second period of time.

The aluminum oxide film formed by ALD method is denser than the aluminum oxide film deposited by sputtering method. The thickness of the former required to obtain the $H_2O$ and $H_2$ blocking tendency equivalent to that of the latter can be accordingly smaller, which is less burdens the etching step. The film formation by ALD method can be batch-processed, which can improve the throughput.

Then, in the same way as in, e.g., the method for fabricating the semiconductor device according to the first embodiment shown in FIGS. 6C to 7B, the semiconductor device is completed.

As described above, according to the present embodiment, the dehydration annealing is made on the lower insulating film in the furnace of the ALD system, and the formation of the capacitor protective film by ALD method follows, whereby the characteristics degradation of the ferroelectric capacitors due to the hydrogen eliminated from the insulating film in the thermal processing in later steps can be prevented. The thermal processing for the insulating film and the formation of the capacitor protective film formed to the insulating film are made continuously without the exposure to the ambient atmosphere, whereby the adsorption of hydrogen and water to the surface of the insulating film or the occlusion of hydrogen and water in the insulating film can be prevented until the capacitor protective film is formed. Thus, the characteristics degradation of the ferroelectric capacitors can be more effectively prevented.

Even when the inter-layer insulating films, etc. to be formed over the first-level metal interconnection layer are formed by a film forming processing using $SiH_4$, Ar, $O_2$, etc.

as the raw material gas, such as high density plasma CVD method or others, the capacitor protective films block hydrogen, whereby the characteristics degradation of the ferroelectric capacitor can be prevented.

The capacitor protective film can be made denser by ALD method than by sputtering method, which allows the capacitor protective film to be thin. This less burdens the etching step. The ALD method facilitates batch processing, which allows the throughput to be increased.

Modified Embodiments

The present invention is not limited to the above-described embodiments and can cover other various modifications.

For example, in the above-described embodiment, the dehydration annealing for eliminating hydrogen and water in the silicon oxide film formed by CVD method using TEOS is explained. However, the effect of the present invention can be obtained not only by forming the silicon oxide film formed by CVD method using TEOS, but also by using other insulating films which can adsorb on the surfaces thereof or occlude therein hydrogen and water.

In the above-described embodiments, the capacitor protective films are provided in contact with the ferroelectric capacitors and between the capacitors and the first-level metal interconnection layer, but one layer of the capacitor protective film, or two or more layers of the capacitor protective film may be further provided.

In the above-described second embodiment, the capacitor protective films are formed by the batch atomic layer deposition system. However, the capacitor protective films may be formed by single-wafer processing using a multi-chamber atomic layer deposition system, as in the first embodiment.

In the above-described embodiments, the semiconductor devices including the ferroelectric capacitors using PZT film as the capacitor dielectric film are explained. The ferroelectric material forming the ferroelectric capacitors is not essentially limited to PZT. The present invention is applicable widely to semiconductor devices including ferroelectric capacitors using ferroelectric materials which have characteristics degradation due to hydrogen and water, e.g., PLZT ((Pb,La)(Zr,Ti)$O_3$), SBT(SrBi$_2$Ta$_2$O$_9$), SBTN(SrBi$_2$(Ta,Nb)$_2$O$_9$), and other ferroelectric materials.

In the above-described embodiment, the ferroelectric film is formed by MOCVD method but may be formed by other film forming processes, e.g., sol-gel method, sputtering method or others.

In the above-described embodiments, the lower electrodes of the ferroelectric capacitors are iridium film, and the upper electrodes of the ferroelectric capacitors are iridium oxide film. However, the materials forming the lower electrodes and the upper electrodes can be suitably selected compatibly with the ferroelectric materials.

It is obvious to those skilled in the art that variations, modifications and combinations can be made in addition to the above.

What is claimed is:

1. A method for fabricating a semiconductor device comprising the steps of:

forming a ferroelectric capacitor over a semiconductor substrate;

forming an insulating film, covering the ferroelectric capacitor;

processing a thermal treatment for eliminating hydrogen and/or water adsorbing on a surface of the insulating film or occluded in the insulating film; and forming a first capacitor protective film of an aluminum oxide film over the insulating film after processing the thermal treatment, the step of processing the thermal treatment and the step of forming the first capacitor protective film being performed continuously in the same system without exposing to an ambient atmosphere.

2. A method for fabricating a semiconductor device according to claim 1, wherein the first capacitor protective film is formed by RF sputtering method.

3. A method for fabricating a semiconductor device according to claim 1, wherein the first capacitor protective film is formed by atomic layer deposition method using an organic aluminum compound and an oxidizing gas containing ozone as raw materials.

4. A method for fabricating a semiconductor device according to claim 1, wherein the thermal treatment is made at 350~650° C.

5. A method for fabricating a semiconductor device according to claim 1, wherein the step of forming the first capacitor protective film is performed at not more than 350° C.

6. A method for fabricating a semiconductor device according to claim 1, further comprising, between the step of forming the ferroelectric capacitor and the step of forming the insulating film, the step of:

forming a second capacitor protective film of an aluminum oxide film.

7. A method for fabricating a semiconductor device according to claim 2, wherein the step of processing the thermal treatment and the step of forming the first capacitor protective film are performed respectively in different processing chambers of a multi-chamber processing system.

8. A method for fabricating a semiconductor device according to claim 3, wherein the step of processing the thermal treatment and the step of forming the first capacitor protective film are performed respectively in different processing chambers of a multi-chamber processing system.

9. A method for fabricating a semiconductor device according to claim 3, wherein the step of processing the thermal treatment and the step of forming the first capacitor protective film are performed in the same reaction furnace of a batch processing system.

10. A method for fabricating a semiconductor device according to claim 6, wherein the second capacitor protective film is formed by atomic layer deposition method using an organic aluminum compound and an oxidizing gas containing ozone as raw materials.

* * * * *